US010430527B1

(12) United States Patent
Scaggs et al.

(10) Patent No.: US 10,430,527 B1
(45) Date of Patent: Oct. 1, 2019

(54) SYSTEM AND METHOD FOR DESIGN AND DETAILING OF STEEL STRUCTURES

(71) Applicant: Design Data, Inc., Lincoln, NE (US)

(72) Inventors: Damon Ellsworth Scaggs, Lincoln, NE (US); Colin Walker Keierleber, Lincoln, NE (US); Marla Eileen Cleveland, Roca, NE (US)

(73) Assignee: Design Data Corporation, Lincoln, NE (US)

( * ) Notice: Subject to any disclaimer, the term of this patent is extended or adjusted under 35 U.S.C. 154(b) by 727 days.

(21) Appl. No.: 14/669,860

(22) Filed: Mar. 26, 2015

Related U.S. Application Data

(60) Provisional application No. 61/972,210, filed on Mar. 28, 2014.

(51) Int. Cl.
*G06F 17/50* (2006.01)
(52) U.S. Cl.
CPC .................. *G06F 17/5004* (2013.01)
(58) Field of Classification Search
CPC .. G06F 17/5009; G06F 17/10; G06F 17/5004; E21B 47/06
USPC ............................................................. 703/1
See application file for complete search history.

(56) References Cited

U.S. PATENT DOCUMENTS

| 2008/0165188 A1* | 7/2008 | Uraki | G06F 17/50 |
| | | | 345/420 |
| 2008/0222568 A1* | 9/2008 | Okuwaki | G06F 17/50 |
| | | | 715/825 |
| 2009/0128558 A1* | 5/2009 | Morello | G06F 17/5004 |
| | | | 345/420 |
| 2013/0185026 A1* | 7/2013 | Vanker | G06F 17/5004 |
| | | | 703/1 |
| 2015/0317415 A1* | 11/2015 | Lederman | G06F 17/5004 |
| | | | 703/1 |

\* cited by examiner

*Primary Examiner* — Eunhee Kim
(74) *Attorney, Agent, or Firm* — Milligan PC LLO

(57) ABSTRACT

In accordance with an exemplary embodiment of the present invention, the present invention discloses a system, method and computer program product to efficiently and accurately create new frame structures by adjustment of specific design parameters. In operation, the computer program product of the present invention utilizes design guidelines to efficiently calculated and determine a solution for a given framing situation. The computer program product is further designed to receive a plurality of parameters regarding a proposed framing structure and to receive user adjustments to selected parameters.

2 Claims, 3 Drawing Sheets

SYSTEM AND METHOD FOR DESIGN AND DETAILING OF STEEL STRUCTURES

RELATED APPLICATIONS

The present application claims priority to U.S. Provisional Application No. 61/972,210 filed Mar. 28, 2014.

FIELD OF INVENTION

The present invention is related in general to the field of steel structure design and, in particular, to a system, method and computer program product for efficient and accurate design of connections between steel structures.

BACKGROUND OF THE INVENTION

The term computer-aided design (CAD) generally refers to a broad variety of computer-based tools used by architects, engineers, and other construction and design professionals. CAD software is often used to prepare a CAD model or models representing frame structures such as buildings. A CAD model may represent a frame structure using model elements representing structural members, such as steel or aluminum beams connected using some form of end treatment. The CAD model can incorporate representations of physical elements, such as columns, beams, and the like that will be included in the structure. Frame structures generally fall into one of three general categories: internal, external or modular. Drawings prepared from such a CAD model can be used in the actual physical construction of the corresponding structure. The CAD model may be prepared and edited by various individuals, including architects and structural engineers.

As part of a design stage or after a design is completed, a structural analysis is typically performed on a structure. Structural analysis can include the computation of deformations, deflections, or internal forces on and within solid and non-solid structures based on information such as a structure's geometry, applied loads and material properties of physical elements making up the structure. The resulting information incorporates data from performing the structural analysis and can incorporate, for example, displacements, axial forces, bending moments, shear forces, stresses, load reaction information, and other information. Result information can also incorporate a history of result information over time.

As known in the prior art, modern design software methods take design requirements into account and indicate whether the proposed design meets the design requirements. The design software provides numerical output values for comparison to numerical design requirement input values so the user can readily see whether and how the design is unacceptable or is over-designed. However, the software of the prior art does not allow a user to efficiently and accurately create a new frame structure by adjustment of specific design parameters.

Still further, recent advancements in the art provide a method for the semi-automated generation of frame members in a CAD model which includes receiving a set of desired attributes for a new frame member and a selection of an element of the solid model assembly. For example, the placement of new frame members may be specified by a selection of an edge or an intersection of surfaces in the solid model assembly. These methods also include generating the new frame member having the desire attributes and placing the new frame member in the CAD model. Additionally, the new frame member may be associated with the element of one or more solid modeling assemblies. Subsequent modifications made to the elements of the solid model assembly are then used to update any frame members associated with a modified element. However, the user constructs a frame by selecting elements of an existing solid model assembly in the CAD model rather than forming and defining new connections.

Based on the foregoing there is a need for a system and method to efficiently and accurately create new frame structures by adjustment of specific design parameters. The present invention overcomes prior art shortcomings by accomplishing these critical objectives.

SUMMARY OF THE DISCLOSURE

To minimize the limitations found in the prior art and other limitations that will be apparent upon the reading of the specification, the preferred embodiment of the present invention provides a system, method and computer program product for the design and detailing of steel structures.

According to a first preferred embodiment, the present invention discloses a system, method and computer program product to efficiently and accurately create new frame structures by adjustment of specific design parameters. Preferably, the design process of the present invention uses the American Institute of Steel Construction (AISC) design guidelines and codes which are hereby incorporated by reference herein. In operation, the computer program product of the present invention utilizes the AISC design guidelines to efficiently calculated and determine a solution for a given framing situation. The computer program product is further designed to receive a plurality of parameters regarding a proposed framing structure and to receive user adjustments to selected parameters.

In accordance with an exemplary embodiment of the present invention, the present invention includes a method which analyzes a framing structure proposed by a user, hypothesize an initial connection between a plurality of steel members based on the framing structure, provides a user interface showing the connections and a plurality of parameters thereof, tests the connections using limit state calculations specified in the American Institute of Steel Construction (AISC) design code, and strengthens the designed connection if the connection fails by changing at least one parameter of the connection that is not set by the user.

In accordance with another exemplary embodiment of the present invention, as a user inputs building elements such as columns and beams, the needed framing system may be automatically designed with their necessary materials, bolts, holes, and welds. In addition, the system of the present invention may preferably "value" engineer the connections on a project, aiding users to design the most economical connections to fabricate and erect.

The present system and computer program product provides automated connection design with user input and accurate detail drawings. These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and to improve the understanding of the various elements and embodiments of the invention. Furthermore, elements that are known to be common and well understood to those in the industry are not depicted in order to provide a clear view of the various embodiments of the invention. Thus, it should be understood that the drawings are generalized in form in the interest of clarity and conciseness.

DETAILED DESCRIPTION OF THE DRAWINGS

Figure 1:
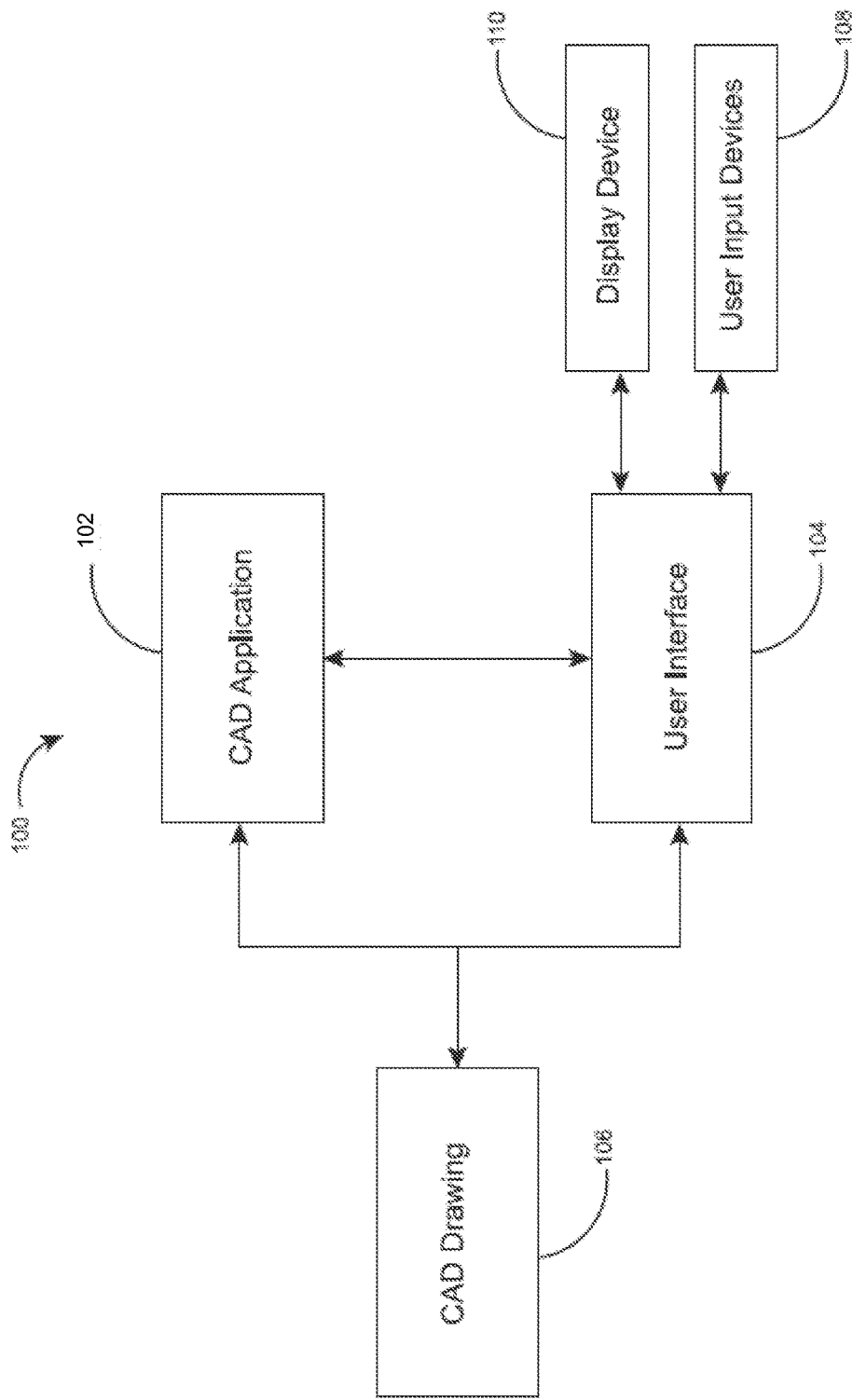
FIG. 1 is a block diagram illustrating a system used to design a steel framing structure in accordance with a preferred embodiment of the present invention.

Reference is now made in detail to the exemplary embodiments of the invention, examples of which are illustrated in the accompanying drawings. Wherever possible, the same reference numbers will be used throughout the drawings to refer to the same or like parts. The description, embodiments and figures are not to be taken as limiting the scope of the claims. It should also be understood that throughout this disclosure, unless logically required to be otherwise, where a process or method is shown or described, the steps of the method may be performed in any order or simultaneously. As used throughout this application, the word "may" is used in a permissive sense (i.e., meaning "having the potential to"), rather than the mandatory sense (i.e. meaning "must").

Before discussing specific embodiments, embodiments of a hardware architecture for implementing certain embodiments is described herein. One embodiment can include one or more computers communicatively coupled to a network. As is known to those skilled in the art, the computer can include a central processing unit ("CPU"), at least one read-only memory ("ROM"), at least one random access memory ("RAM"), at least one hard drive ("HD"), and one or more input/output ("I/O") device(s). The I/O devices can include a keyboard, monitor, printer, electronic pointing device (such as a mouse, trackball, stylist, etc.), or the like. In various embodiments, the computer has access to at least one database over the network.

ROM, RAM, and HD are computer memories for storing computer-executable instructions executable by the CPU. Within this disclosure, the term "computer-readable medium" is not limited to ROM, RAM, and HD and can include any type of data storage medium that can be read by a processor. In some embodiments, a computer-readable medium may refer to a data cartridge, a data backup magnetic tape, a floppy diskette, a flash memory drive, an optical data storage drive, a CD-ROM, ROM, RAM, HD, or the like.

At least portions of the functionalities or processes described herein can be implemented in suitable computer-executable instructions. The computer-executable instructions may be stored as software code components or modules on one or more computer readable media (such as non-volatile memories, volatile memories, DASD arrays, magnetic tapes, floppy diskettes, hard drives, optical storage devices, etc. or any other appropriate computer-readable medium or storage device). In one embodiment, the computer-executable instructions may include lines of complied C++, Java, HTML, or any other programming or scripting code such as R, Python and/or Excel. Further, the present invention teaches the use of processors to perform the functionalities and processes described herein. As such, processor is understood to mean the computer chip or processing element that executes the computer code needed for the performance of a specific action.

Additionally, the functions of the disclosed embodiments may be implemented on one computer or shared/distributed among two or more computers in or across a network. Communications between computers implementing embodiments can be accomplished using any electronic, optical, radio frequency signals, or other suitable methods and tools of communication in compliance with known network protocols.

Additionally, any examples or illustrations given herein are not to be regarded in any way as restrictions on, limits to, or express definitions of, any term or terms with which they are utilized. Instead, these examples or illustrations are to be regarded as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

The present embodiment discloses a system, method and a computer program product for the design and detailing of steel structures. The present invention improves the efficiency and accuracy of much of the work of a steel detailer. This includes connection design, production of member and part drawings, ordering lists and output to automatic shop cutting and drilling machines.

With reference now to FIG. 1, a block diagram illustrating a system used to design a steel framing structure in accordance with a preferred embodiment of the present invention will now be discussed. As shown in FIG. 1 the system 100 comprises, without limitation, a CAD application 102, a user interface 104, a CAD model or drawing 106, user input devices 108, and a display device 110. The CAD application 102 may be configured to allow users interacting with the user interface 104 to compose a CAD model 106. Accordingly, the CAD application 102 and the user interface 104 may include programmed routines or instructions allowing users to create, edit, load, and save the CAD model 106. The components shown in FIG. 1 are simplified to highlight aspects of the present invention and a typical CAD application 102 and user interface 104 may include a broad variety of additional tools and features used to compose and manage the CAD model 106.

The components illustrated in the system 100 may include computer software applications executing on existing computer systems, e.g.; desktop computers, server computers, laptop computers, tablet computers, and the like. The software applications described herein, however, are not limited to any particular computing system and may be adapted to take advantage of new computing systems as they become available. Additionally, the components illustrated in system 100 may be implemented as software applications that execute on a single computer system or on distributed systems communicating over computer networks such as local area networks or large, wide area networks, such as the Internet. Also, in one embodiment, the CAD application 102 and the user interface 104 may be provided as an application program (or programs) stored on computer readable media such as a CD-ROM, DVD-ROM, flash memory module, or other tangible storage media.

According to one aspect of the present invention, the present embodiment discloses a computer program product comprising a computer readable storage medium having a computer readable program for automatic design and optimization of connections between steel members. The design process is based on at least one steel design guideline and code—for example, the American Institute of Steel Construction (AISC) design guidelines and codes. The computer program product utilizes the steel design guidelines to calculate and identify a solution for a given framing situation. Using a specific input reaction or a percentage of uniform allowable load, the computer program product may further automatically determine the correct hole and weld sizes, plate thickness and bolt types for each connection and create a solid representation of the design.

According to a further aspect of the present invention, the exemplary computer program product is preferably configured to receive a plurality of parameters regarding a proposed framing structure. According to this aspect, the user can set parameters in the connection and the computer program product will determine a design respecting these values. Preferably, the computer program product may use an iterative design method and maintain the user set values when determining a new connection. Preferably, the computer program product may also provide a set of documentation showing the calculations which indicate that the proposed connection will hold a given load.

Figure 2:
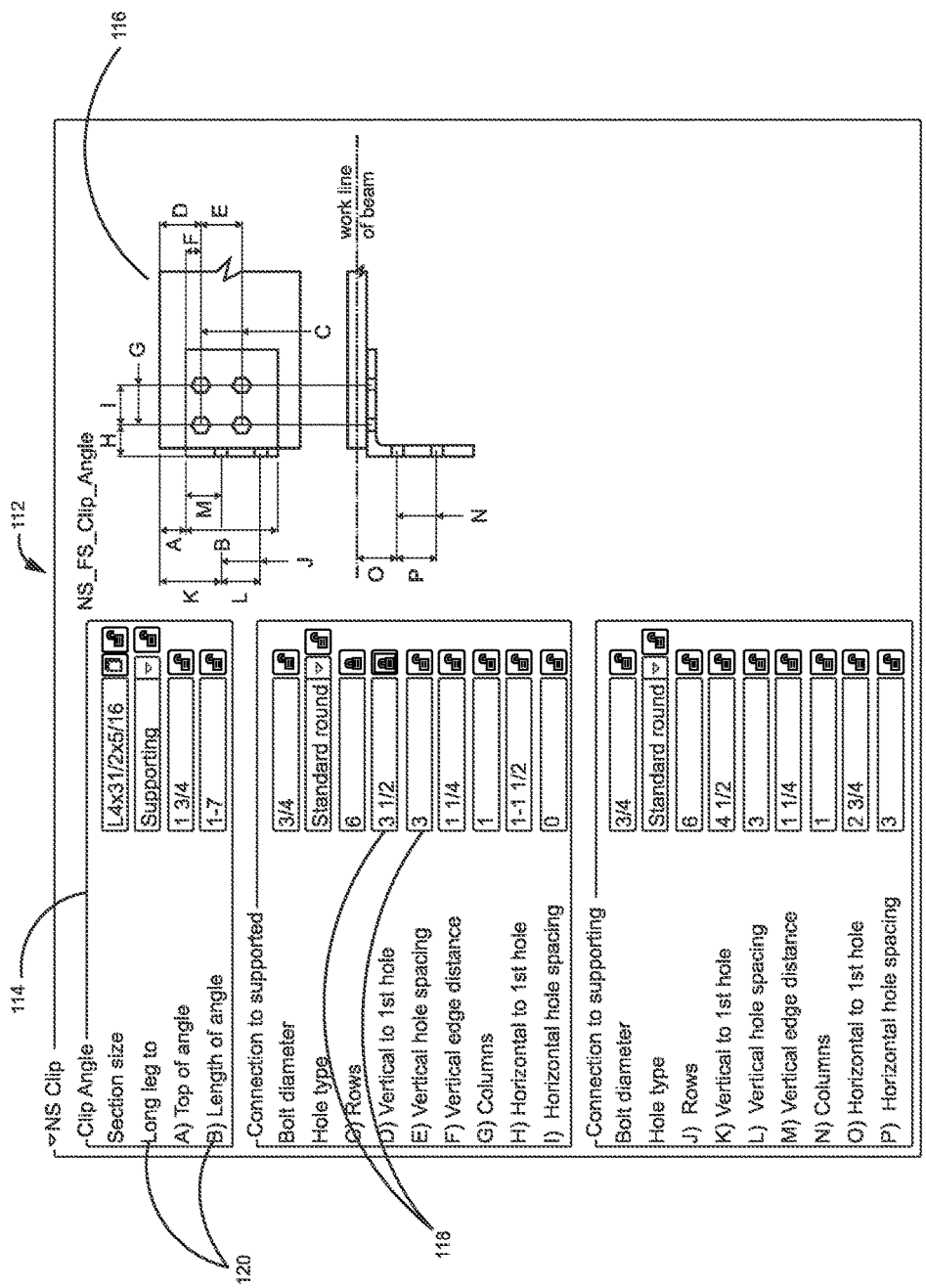
FIG. 2 illustrates an exemplary dialog box used to specify parameters regarding connection requirements of a steel framing structure.

With reference now to FIG. 2, an exemplary dialog box used to specify parameters regarding connection requirements of an exemplary steel framing structure will now be discussed. As shown in FIG. 2, an exemplary dialog box 112 used to specify parameters 120 regarding connection requirements of a steel framing structure is shown. As illustrated, the user interface 104 of the system 100 provides the dialog box 112 containing all of the parameters 120 of a specific connection between pluralities of steel members in the framing structure. The dialog box 112 as shown includes a selection panel 114 and a display panel 116. The selection panel 114 preferably allows the user to specify the desired connection requirements for a specific connection. The selection panel 114 preferably further includes a plurality of fields 118 that describe the various parameters 120 of a connection. The display panel 116 preferably displays the connection specified in the selection panel 114. In the example shown, the exemplary dialog box 112 shows a portion of a connection. As shown, the dialog box 112 is displaying a near side clip angle material in a clip angle connection and the various parameters such as material, holes, bolts, welds and cuts.

Figure 3:
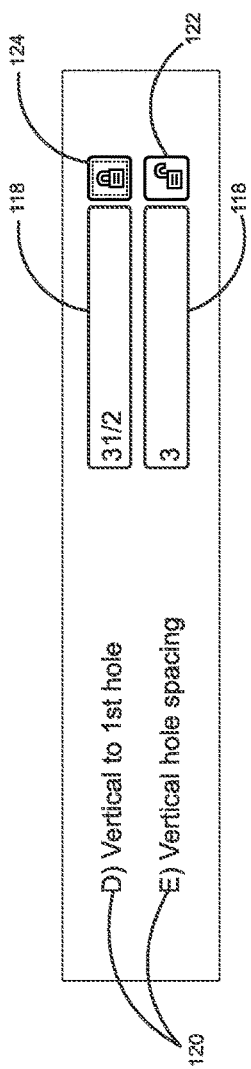
FIG. 3 illustrates an exemplary dialog box used to specify parameters regarding connection requirements of a steel framing structure.

With reference now to FIG. 3, an exemplary dialog box used to specify parameters regarding connection requirements of the steel framing structure will now be discussed. As shown in FIG. 3, a pair of fields 118 in the exemplary dialog box 112 shown in FIG. 2 is illustrated. Each field 118 that is designed by the automatic design process of the computer program product of the present invention is denoted with an unlocked icon 122. Any field 118 that is set by the user is denoted with a locked icon 124. The unlocked icon 122 denotes that the parameter 120 "vertical hole spacing" is optimized by the computer program product. The locked icon 124 denotes that the parameter 120 "vertical to first hole" is set by the user and is bypassed by the computer program product during the design process.

The computer program product enables a user to automatically design connections using a 3D model with a multitude of options for beams, columns, bracing and joists. Connections are designed based on parameters 120 that the user defines for each job. By designating connection specifications such as material, edge distance, and cope criteria etc., the computer program product will preferably automatically generate connections that meet the user's requirements.

Figure 4:
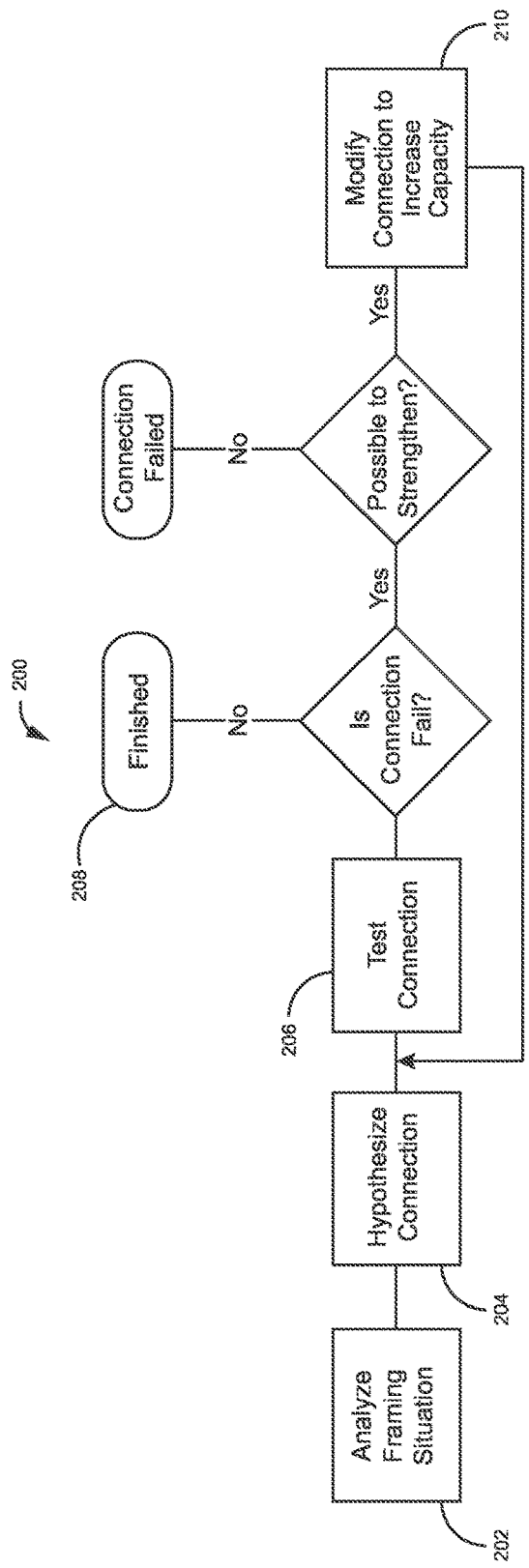
FIG. 4 is a flow diagram illustrating a design process of a steel framing structure.

With reference now to FIG. 4, a flow diagram illustrating an exemplary design process of a steel framing structure in accordance with a preferred embodiment of the present invention will now be discussed. As shown in FIG. 4, the exemplary flow diagram 200 illustrates an iterative design process. As an exemplary first step, the computer program product analyzes a framing structure proposed by a user as shown in block 202. An initial connection between pluralities of steel members based on the framing structure is then hypothesized as shown in block 204. A user interface 104 showing the connection and a plurality of parameters 120 thereof is preferably provided by the computer program product. The user interface 104 is preferably further configured to receive at least one parameter 120 from the user regarding connection requirements. Preferably, the computer program product then tests the connection using the limit state calculations specified in the AISC design code as shown in block 206. If the connection passes, the design is finished as shown in block 208. If the connection fails, the computer program product preferably strengthens the connection by changing a parameter or set of parameters while preferably maintaining the parameters set by the user as shown in block 210. According to a preferred embodiment, if a parameter is locked by the user, it is bypassed and another method of strengthening the connection is chosen. The computer program product then tests the connection. This process is repeated until either the connection can no longer be strengthened or it passes. The proposed framing structure is preferably finalized when all of the connections of the framing structure have been analyzed and tested.

In one embodiment, the Autodesk® Revit® application program (an associated utilities) may be used.

In the present embodiment, details, sub-material and erection drawings may be automatically generated. According to a further aspect of the present invention, the system 100 and computer program product of the present invention may further provide computer numerical control (CNC) data, MRP information and #D models, and other tools beneficial to detailers. Further, the system 100 and computer program product may provide expanded design calculations that give users the full formulas for all force checks of connections. Thus, users may see how the computer program product arrived at the connection results. Further, the system 100 and the computer program product may provide automatic design optimization by the system 100 as well as user control of the design. The computer program product may further be configured to receive a plurality of parameters 120 regarding the framing structure which helps in capturing the user's design intent in an accurate and efficient way by means of the user interface 104.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method implemented by a computer program product which includes one or more computer readable storage media having encoded thereon computer executable instructions which, when executed upon one or more computer processors, performs a method for supplying modified data to a requesting application, the method comprising:

identifying a point of connection between at least two steel members within the design of framing structure;

calculating the structural needs of the identified point of connection;

determining a first connection structure based on the calculated structural needs of the identified point of connection;

calculating one or more selectable parameters for the connection structure made between the two steel members using the first connection structure; wherein the selectable parameters comprise edge distance and cope criteria;

displaying one or more selectable parameters for the first connection structure;

receiving a first user selected parameter from the group of selectable parameters; wherein the first user selected parameter comprises an edge distance parameter; wherein the first user selected parameter is received from a user interface device to create a modified connection structure;

performing a first limit state calculation for the modified connection structure using the user selected edge distance parameter;

updating a cope criteria parameter to create an updated cope criteria parameter in response to the failed first limit state calculation, wherein the updated cope criteria parameter is calculated using output from the first limit state calculation;

performing a second limit state calculation for the modified connection structure using the user selected edge distance parameter and the system updated cope criteria parameter;

generating measurements for hole and weld sizes, plate thickness and bolt types for the modified connection structure using the user selected edge distance parameter and the system updated cope criteria parameter; and generating material lists based on the user selected edge distance parameter and the system updated cope criteria parameter.

2. A method implemented by a computer program product which includes one or more computer readable storage media having encoded thereon computer executable instructions which, when executed upon one or more computer processors, performs a method for supplying modified data to a requesting application, the method comprising:

identifying a point of connection between at least two steel members within the design of framing structure;

calculating the structural needs of the identified point of connection;

determining a first connection structure based on the calculated structural needs of the identified point of connection;

calculating one or more selectable parameters for the connection structure made between the two steel members using the first connection structure; wherein the selectable parameters comprise edge distance and cope criteria;

displaying one or more selectable parameters for the first connection structure;

receiving a first user selected parameter from the group of selectable parameters; wherein the first user selected parameter comprises a cope criteria parameter; wherein the first user selected parameter is received from a user interface device to create a modified connection structure;

performing a first limit state calculation for the modified connection structure using the user selected cope criteria parameter;

updating an edge distance parameter to create an updated edge distance parameter in response to the failed first limit state calculation; wherein the updated edge distance parameter is calculated using output from the first limit state calculation;

performing a second limit state calculation for the modified connection structure using the user selected cope criteria parameter and the system updated edge distance parameter;

generating measurements for hole and weld sizes, plate thickness and bolt types for the modified connection structure using the user selected cope criteria parameter and the system updated edge distance parameter; and generating material lists based on the user selected cope criteria parameter and the system updated edge distance parameter.

* * * * *